(12) United States Patent
Kim et al.

(10) Patent No.: US 12,009,231 B2
(45) Date of Patent: Jun. 11, 2024

(54) METHOD OF BONDING SUBSTRATES UTILIZING A SUBSTRATE HOLDER WITH HOLDING FINGERS

(71) Applicant: SAMSUNG ELECTRONICS CO., LTD., Suwon-si (KR)

(72) Inventors: Jun-hyung Kim, Yongin-si (KR); Sung-hyup Kim, Hwaseong-si (KR); Tae-yeong Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/119,909

(22) Filed: Mar. 10, 2023

(65) Prior Publication Data
US 2023/0215744 A1    Jul. 6, 2023

Related U.S. Application Data

(63) Continuation of application No. 16/507,407, filed on Jul. 10, 2019, now Pat. No. 11,640,912.

(30) Foreign Application Priority Data

Aug. 30, 2018   (KR) .................. 10-2018-0103029

(51) Int. Cl.
*H01L 21/67* (2006.01)
*H01L 21/66* (2006.01)
(Continued)

(52) U.S. Cl.
CPC ...... *H01L 21/67092* (2013.01); *H01L 21/673* (2013.01); *H01L 21/68735* (2013.01);
(Continued)

(58) Field of Classification Search
CPC ............ H01L 21/67092; H01L 21/673; H01L 21/68735; H01L 2221/683; H01L 2221/05;
(Continued)

(56) References Cited

U.S. PATENT DOCUMENTS

| 6,092,713 A | 7/2000 | Kim et al. |
| 6,922,229 B2 | 7/2005 | Yawata et al. |

(Continued)

FOREIGN PATENT DOCUMENTS

| JP | 4661808 B2 | 3/2011 |
| JP | 4671841 B2 | 4/2011 |

(Continued)

OTHER PUBLICATIONS

Korean Office action issued Feb. 14, 2023 for corresponding KR Patent Application No. 10-2018-0103029.
(Continued)

*Primary Examiner* — Khiem D Nguyen
(74) *Attorney, Agent, or Firm* — Muir Patent Law, PLLC

(57) ABSTRACT

A substrate bonding apparatus includes a substrate susceptor to support a first substrate, a substrate holder over the substrate susceptor to hold a second substrate, the substrate holder including a plurality of independently moveable holding fingers, and a chamber housing to accommodate the substrate susceptor and the substrate holder.

20 Claims, 15 Drawing Sheets

(51) Int. Cl.
*H01L 21/673* (2006.01)
*H01L 21/687* (2006.01)
*H01L 23/00* (2006.01)
*H01L 25/00* (2006.01)
*H01L 27/146* (2006.01)

(52) U.S. Cl.
CPC .............. *H01L 22/12* (2013.01); *H01L 24/03* (2013.01); *H01L 24/05* (2013.01); *H01L 24/80* (2013.01); *H01L 25/50* (2013.01); *H01L 27/1469* (2013.01); *H01L 2221/683* (2013.01); *H01L 2224/05* (2013.01); *H01L 2224/80895* (2013.01); *H01L 2224/80896* (2013.01)

(58) Field of Classification Search
CPC . H01L 2221/80895; H01L 2221/80896; H01L 21/2007; H01L 21/185; H01L 2224/05; H01L 2224/80895; H01L 2224/80896; H01L 2224/75301
See application file for complete search history.

(56) References Cited

U.S. PATENT DOCUMENTS

| | | | |
|---|---|---|---|
| 7,682,933 | B1 | 3/2010 | Loomis |
| 7,948,034 | B2 | 5/2011 | George et al. |
| 8,268,113 | B2 | 9/2012 | Muramoto et al. |
| 8,790,993 | B2 | 7/2014 | Kerdiles et al. |
| 8,822,307 | B2 | 9/2014 | Yamaguchi et al. |
| 8,895,356 | B2 | 11/2014 | Maeng et al. |
| 9,355,882 | B2 | 5/2016 | Wu et al. |
| 9,490,158 | B2 * | 11/2016 | Huang .............. H01L 21/68785 |
| 10,373,847 | B2 | 8/2019 | Inamasu |
| 10,410,892 | B2 * | 9/2019 | Lu ............................ H01L 24/80 |
| 10,639,875 | B2 | 5/2020 | Kim et al. |
| 10,840,213 | B2 | 11/2020 | Matsunaga et al. |
| 11,056,356 | B1 * | 7/2021 | Mueller .................... C03C 27/06 |
| 2012/0329241 | A1 * | 12/2012 | Yamaguchi ....... H01L 21/67092 438/455 |
| 2016/0155721 | A1 * | 6/2016 | Sugakawa ............. H01L 21/681 438/5 |
| 2018/0019226 | A1 * | 1/2018 | Matsunaga .............. H01L 24/75 |
| 2018/0076037 | A1 * | 3/2018 | Kurz ................... H01L 21/2007 |
| 2018/0122845 | A1 | 5/2018 | Kim et al. |
| 2018/0158796 | A1 | 6/2018 | Otsuka et al. |
| 2018/0370210 | A1 * | 12/2018 | Kim ....................... H01L 24/08 |

FOREIGN PATENT DOCUMENTS

| | | |
|---|---|---|
| JP | 5180557 B2 | 4/2013 |
| JP | 2018-010966 A | 1/2018 |
| KR | 10-2003-0074422 A | 9/2003 |
| KR | 10-1521971 B1 | 5/2015 |
| KR | 10-2015-0136848 A | 12/2015 |
| KR | 10-2018-0007315 A | 1/2018 |
| KR | 10-2018-0007320 A | 1/2018 |

OTHER PUBLICATIONS

Korean Notice of Allowance dated Aug. 3, 2023, of the corresponding KR Patent Application No. 10-2018-0103029.

* cited by examiner

METHOD OF BONDING SUBSTRATES UTILIZING A SUBSTRATE HOLDER WITH HOLDING FINGERS

CROSS-REFERENCE TO RELATED PATENT APPLICATION

This is a continuation of U.S. patent application Ser. No. 16/507,407 filed Jul. 10, 2019, issued as U.S. Pat. No. 11,640,912, which is incorporated by reference herein in its entirety.

Korean Patent Application No. 10-2018-0103029, filed on Aug. 30, 2018, in the Korean Intellectual Property Office, and entitled: "Apparatus for Bonding Substrates and Method of Bonding Substrates," is incorporated by reference herein in its entirety.

BACKGROUND

1. Field

Embodiments relate to a substrate bonding apparatus and a substrate bonding method, and more particularly, to a substrate bonding apparatus and a substrate bonding method, by which a semiconductor device is manufactured at low costs and with improved precision.

2. Description of the Related Art

For the development of a semiconductor device having a three-dimensional (3D) connection structure, two semiconductor wafers need to be precisely bonded with each other. When the two semiconductor wafers are very precisely bonded together, semiconductor devices providing high performance, while having small sizes, can be manufactured at low costs and with high reliability. Although various methods to bond two semiconductor wafers together are being developed, further bonding precision is necessary.

SUMMARY

According to an aspect, there is provided a substrate bonding apparatus including a substrate susceptor configured to support a first substrate downwards, a substrate holder located over the substrate susceptor and configured to hold a second substrate, and a chamber housing configured to accommodate the substrate susceptor and the substrate holder, wherein the substrate holder includes a plurality of holding fingers that are operable independently.

According to another aspect, there is provided a substrate bonding apparatus including a substrate susceptor configured to support a first substrate downwards, a substrate holder located over the substrate susceptor and configured to hold a second substrate, and a pressing finger arranged at a location corresponding to a center of the second substrate and configured to press the second substrate toward the first substrate, wherein the substrate holder is configured to release holding of the second substrate after a spontaneous bonding propagation between the first substrate and the second substrate is sufficiently conducted and an edge of the second substrate approaches an edge of the first substrate.

According to yet another aspect, there is provided a substrate bonding method including arranging a substrate holder holding a second substrate disposed thereon, on a substrate susceptor having a first substrate disposed thereon, such that the first and second substrates are aligned with each other, bringing a center of the second substrate to contact the first substrate, allowing a spontaneous bonding propagation between the first substrate and the second substrate to be sufficiently conducted, bringing the second substrate close to the first substrate while maintaining holding of the second substrate, and releasing the holding of the second substrate.

According to yet another aspect, there is provided a substrate bonding apparatus, including a substrate susceptor to support a first substrate, a substrate holder over the substrate susceptor to hold a second substrate, and a pressing finger at a center of the substrate holder, the pressing finger being moveable toward the substrate susceptor to press the second substrate toward the first substrate, wherein the substrate holder is to release holding the second substrate after a spontaneous bonding propagation between the first substrate and the second substrate is sufficiently conducted and an edge of the second substrate approaches an edge of the first substrate, and wherein the substrate holder is to release holding of the second substrate after moving toward the first substrate until a distance between the edge of the second substrate and the edge of the first substrate is about 1 μm to about 50 μm.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, embodiments will be described more fully with reference to the accompanying drawings, in which exemplary embodiments are shown.

Figure 1:
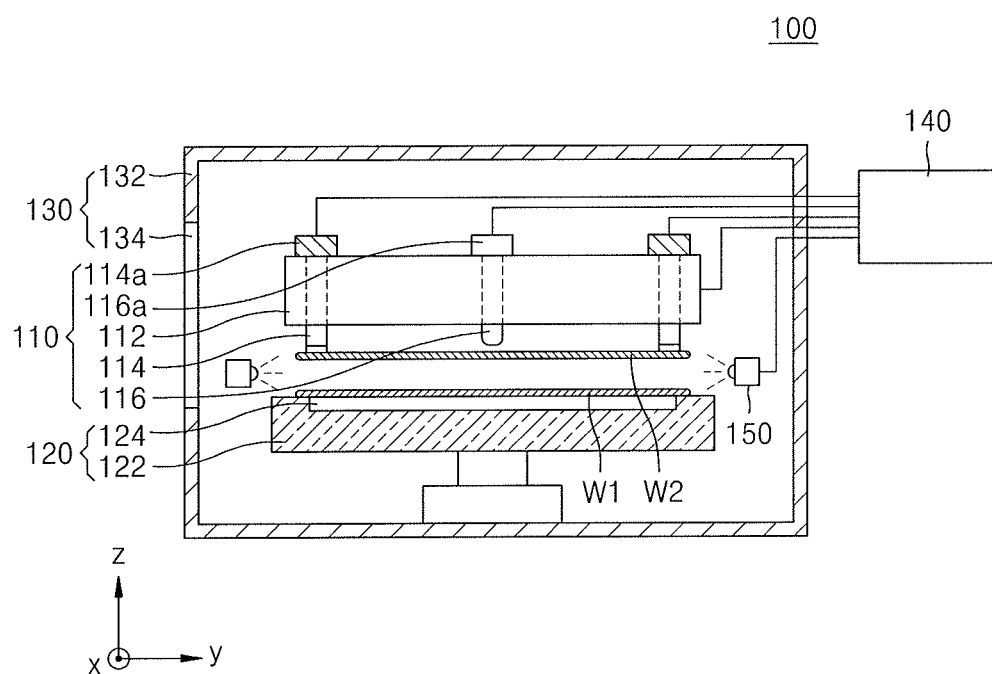
FIG. 1 illustrates a side view of a substrate bonding apparatus according to an embodiment.

FIG. 1 is a side view of a substrate bonding apparatus 100 according to an embodiment.

Referring to FIG. 1, the substrate bonding apparatus 100 may include a substrate susceptor 120, a substrate holder 110 located over the substrate susceptor 120, and a chamber housing 130 that accommodates the substrate susceptor 120 and the substrate holder 110.

The chamber housing 130 may surround the substrate susceptor 120 and the substrate holder 110. According to some embodiments, a vacuum pressure or an atmospheric pressure may be formed within the chamber housing 130. A first substrate W1 and a second substrate W2 respectively supported or held by the substrate susceptor 120 and the substrate holder 110 may be protected by the chamber housing 130.

The chamber housing 130 may have a wall 132 and an opening 134, e.g., the opening 134 may extend through the wall 132. The first and second substrates W1 and W2 may be carried into or carried out of the chamber housing 130 via the opening 134. The opening 134 may be sealed as necessary to protect the inside of the chamber housing 130 from an external environment.

The substrate susceptor 120 may support the first substrate W1 seated thereon. According to some embodiments, the first substrate W1 may be a single crystal substrate. According to some embodiments, the first substrate W1 may be a silicon wafer.

The substrate susceptor 120 may include a susceptor body 122 and a first substrate fixing unit 124. For example, as illustrated in FIG. 1, the first substrate fixing unit 124 may be within the susceptor body 122, e.g., a top surface of the first substrate fixing unit 124 may be exposed by and substantially level with a top surface of the susceptor body 122. The substrate susceptor 120 may be configured to fix the first substrate W1 by using, e.g., a vacuum or an electrostatic force. When the substrate susceptor 120 fixes the first substrate W1 by using a vacuum, the first substrate fixing unit 124 may be configured to form a lower pressure than an ambient pressure at a bottom surface of the first substrate W1. When the substrate susceptor 120 fixes the first substrate W1 by using an electrostatic force, the first substrate fixing unit 124 may be configured to generate an electrostatic force allowing the first substrate W1 to be fixed.

The substrate holder 110 may be provided to face the substrate susceptor 120, e.g., the first substrate W1 may be between the substrate susceptor 120 and the substrate holder 110. The substrate holder 110 may hold the second substrate W2. The substrate holder 110 may hold the second substrate W2 from the top of the second substrate W2, e.g., the second substrate W2 may be between the first substrate W1 and the substrate holder 110. In other words, the substrate holder 110 may contact an upper surface of the second substrate W2 and hold the second substrate W2. According to some embodiments, the second substrate W2 may be a single crystal substrate. According to some embodiments, the second substrate W2 may be a silicon wafer.

Figure 2:
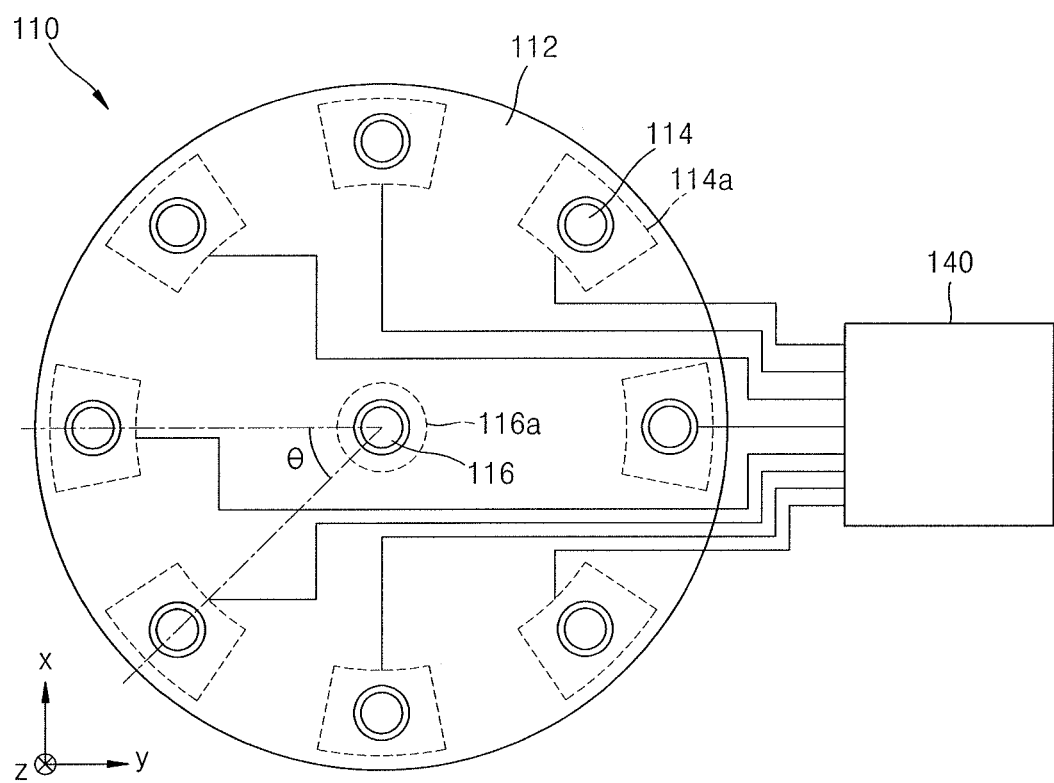
FIG. 2 illustrates a bottom view of a substrate holder included in the substrate bonding apparatus of FIG. 1.

FIG. 2 is a bottom view of the substrate holder 110.

Referring to FIGS. 1 and 2, an outer circumference of a substrate holder body 112 may be generally a circle. A plurality of holding fingers 114 may be arranged substantially at regular intervals along the outer circumference of the substrate holder body 112. Angles θ formed between each two adjacent holding fingers 114 from a center of a bottom of the substrate holder 110 may be substantially uniform.

The substrate holder 110 may have more than four holding fingers 114. According to some embodiments, the substrate holder 110 may have eight holding fingers 114. According to some embodiments, the substrate holder 110 may have an odd number of holding fingers 114, e.g., five, seven, nine, eleven, thirteen, or fifteen holding fingers 114. According to some embodiments, the number of holding fingers 114 may be thirty or less.

The holding fingers 114 may extend and be configured to reciprocate, e.g., move, in a direction substantially perpendicular to the second substrate W2 (i.e., in the z direction). The reciprocation, e.g., movement, of the holding fingers 114 may be implemented by holding finger actuators 114a. Operations of the holding finger actuators 114a may be controlled by a controller 140.

As shown in FIG. 2, the holding finger actuators 114a may be independently electrically connected to the controller 140 and may be independently controlled by the controller 140, e.g., the controller 140 may control each finger actuator 114a independently of the other finger actuators 114a. In other words, respective motions of, e.g., each of, the holding fingers 114 according to motions of the respective holding finger actuators 114a may be independent from each other. This will be described later in more detail. For example, multilayer piezoelectric actuators, voice coil motors (VCMs), or lag and pinion coupled with a motor may be used as the holding finger actuators 114a, but embodiments are not limited thereto.

A pressing finger 116 for pressing the second substrate W2 may be provided on the center of the substrate holder 110, e.g., the holding fingers 114 may surround the pressing finger 116. The pressing finger 116 may be configured to reciprocate, e.g., move, in the direction substantially perpendicular to the second substrate W2 (i.e., in the z direction). The reciprocation of the pressing finger 116 may be implemented by a pressing finger actuator 116a. An operation of the pressing finger actuator 116a may be controlled by the controller 140. For example, a multilayer piezoelectric actuator, a VCM, or a lag and pinion coupled with a motor may be used as the pressing finger actuator 116a, but embodiments are not limited thereto.

A relative distance between the first substrate W1 and the second substrate W2, e.g., along the z direction, may be sensed by a distance sensor 150, e.g., the distance sensor 150 may be positioned within the chamber housing 130 to face a space between the substrate holder 110 and the substrate susceptor 120. According to some embodiments, the distance sensor 150 may measure a distance between the first substrate W1 and the second substrate W2 by perceiving images of the first substrate W1 and the second substrate W2. According to some embodiments, the distance sensor 150 may measure the distance between the first substrate W1 and the second substrate W2 by radiating electromagnetic waves to the first substrate W1 and the second substrate W2 and then analyzing electromagnetic waves reflected from the first substrate W1 and the second substrate W2. The distance sensor 150 recognizes the relative distance between the first substrate W1 and the second substrate W2 according to various methods, and embodiments are not limited to the above-described methods.

According to some embodiments, each of the holding finger actuators 114a may have an arm shape. When the holding finger actuator 114a is in the shape of an arm, each of the holding fingers 114 is coupled to one side of the arm. As the arm operates, the holding finger 114 may move in the z direction.

FIGS. 3A through 3E are conceptual views of stages in a method of bonding the first substrate W1 and the second substrate W2 together, according to an embodiment.

Figure 3A:
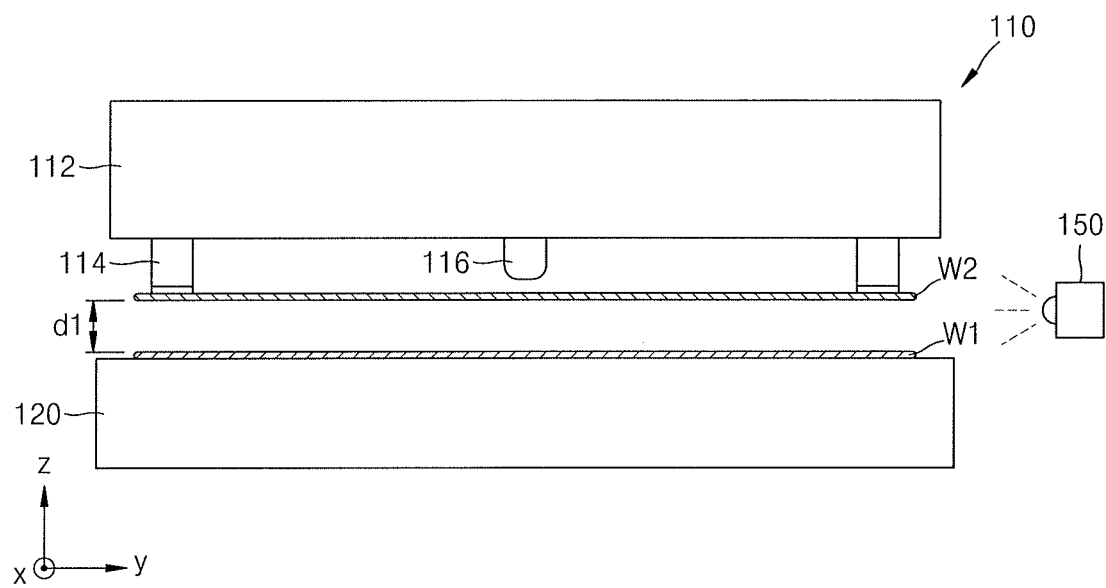
FIGS. 3A through 3E illustrate conceptual views of stages in a method of bonding a first substrate and a second substrate together, according to an embodiment.

Referring to FIG. 3A, the substrate holder 110 having the second substrate W2 held thereon may be arranged over the substrate susceptor 120 having the first substrate W1 disposed thereon, so that the first substrate W1 and the second substrate W2 are aligned with each other. For example, as illustrated in FIG. 3A, the first and second substrates W1 and W2 may be positioned to face each other with a predetermined distance, e.g., a first distance d1, therebetween along the z direction. For example, as further illustrated in FIG. 3A, the distance sensor 150 may be peripheral to, e.g., and between, the substrate holder 110 and the substrate susceptor 120, and may face the distance between the first and second substrates W1 and W2.

The substrate holder 110 may be moveable on an x-y plane to achieve the alignment, e.g., the controller 140 may move the substrate holder 110 in the x direction and/or the y direction until the first and second substrates W1 and W2 are aligned. According to some embodiments, an alignment mark may be marked on the first substrate W1 and/or the second substrate W2 in order to achieve the alignment, e.g., achieve alignment of respective edges of the first and second substrates W1 and W2.

Moreover, the substrate holder 110 may be moveable in the z direction to achieve the alignment, e.g., the controller 140 may move the substrate holder 110 in the z direction until the first and second substrates W1 and W2 are aligned and are parallel at the first distance d1. The first distance d1 between the first substrate W1 and the second substrate W2 may be about 30 µm to about 100 µm. In this alignment step, when the first distance d1 is larger than about 100 µm, a bonding propagation (which will be described later) may be insufficient. On the other hand, when the first distance d1 is smaller than about 30 µm, the bonding propagation may be excessive, and thus voids may be generated in bonding-propagated portions of the first and second substrates W1 and W2.

The alignment between the substrate holder 110 and the substrate susceptor 120 may be feedback-controlled, e.g., by a sensor system including the distance sensor 150 and the controller 140. In another example, an additional controller (other than the controller 140) may be used to control movement of the substrate holder 110 in the x direction, y direction, and z direction.

Figure 3B:
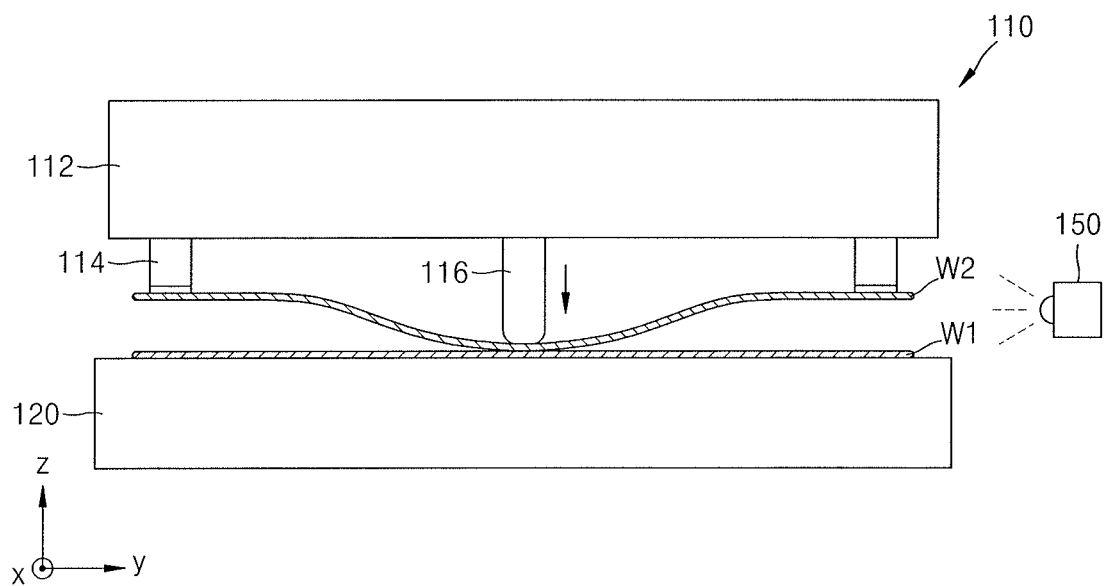

Referring to FIG. 3B, i.e., a first phase, the second substrate W2 may be pressed toward the first substrate W1 by using the pressing finger 116, e.g., only the pressing finger 116 may move toward the first substrate W1 (along the arrow in FIG. 3B). At this time, the holding fingers 114 of the substrate holder 110 may continuously hold the second substrate W2, e.g., the holding fingers 114 may continuously maintain edges of the second substrate W2 at a stationary state while the pressing finger 116 pushes the center of the second substrate W2. As the pressing finger 116 presses the second substrate W2, the center of the second substrate W2 may contact the first substrate W1.

Figure 3C:
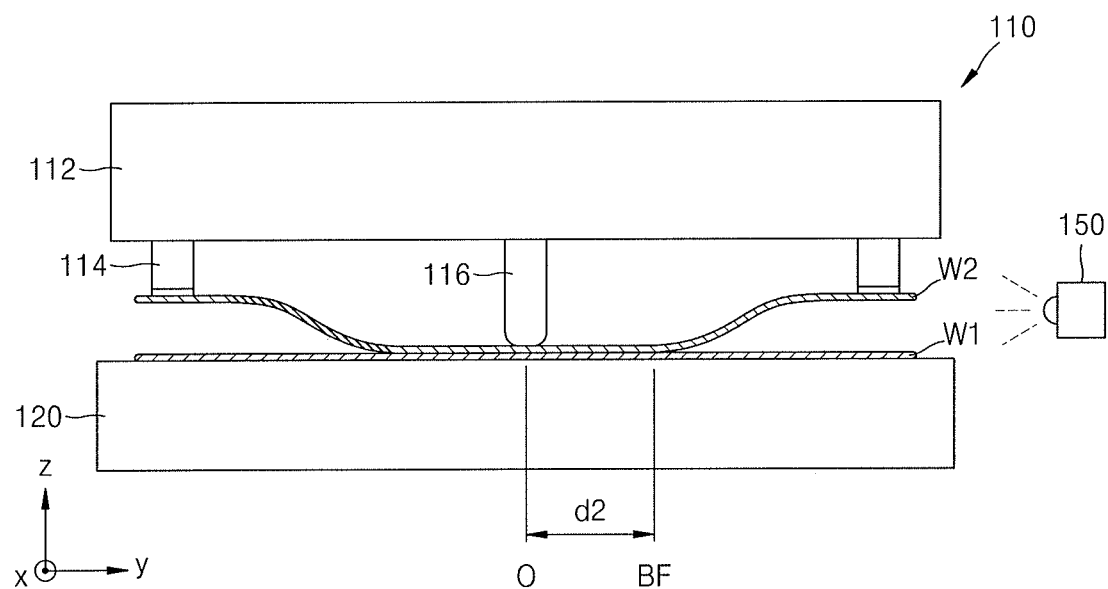

Referring to FIG. 3C, i.e., a second phase, a sufficient spontaneous bonding propagation between the first substrate W1 and the second substrate W2 may be allowed. For example, referring to FIG. 3C, the spontaneous bonding propagation may spread from the centers of the contacting first and second substrates W1 and W2, i.e., from the contact point between the first and second substrates W1 and W2 that overlaps the pressing finger 116 (point O in FIG. 3C), towards edges of the first and second substrates W1 and W2, e.g., along a second distance d2 in a radial direction.

In detail, according to some embodiments, respective surfaces of the first substrate W1 and the second substrate W2 that face each other may have been plasma-processed, e.g., before the beginning of the bonding process. In this case, electrostatic attraction occurs between the facing surfaces of the first and second substrates W1 and W2, e.g., when the distance between the first and second substrates W1 and W2 is sufficiently small. Accordingly, a bonding propagation may occur, so the first and second substrates W1 and W2 may gradually bond together along the second distance d2 due to the electrostatic attraction therebetween (e.g., from a center O to a bonding front BF in FIG. 3C). That is, due to the bonding propagation, the respective surfaces of the two first and second substrates W1 and W2 may gradually bond together from initial contact portions thereof even without special, e.g., further, application of an external force.

In this case, a boundary may be defined between the bonded and un-bonded portions of the first and second substrates W1 and W2. That is, the boundary, i.e., the bonding front BF, may be defined between a first portion (a portion between points O and BF of FIG. 3C) where the respective surfaces of the two first and second substrates W1 and W2 are bonded to each other and a second portion (a portion to the right of point BF of FIG. 3C) where the respective surfaces of the two first and second substrates W1 and W2 are not bond with each other.

If the holding fingers 114 were to stop holding the second substrate W2, and an edge of the second substrate W2 were to freely fall and contact an edge of the first substrate W1, the bonding front BF would have propagated up to the edge of the first substrate W1 (or the second substrate W2), e.g., too quickly and non-uniformly, thereby generating voids in bonding interface between the first and second substrates W1 and W2. In contrast, referring to FIG. 3C, since the holding fingers 114, according to embodiments, hold the second substrate W2, the bonding front BF may not be propagated up to the edge of the first substrate W1 (or the second substrate W2). The bonding front BF may be propagated only up to a position where attraction between the respective surfaces of the two first and second substrates W1 and W2 and an elastic restoring force of the second substrate W2 balance.

If the first distance d1 between the edge of the second substrate W2 and the edge of the first substrate W1 increases, the second distance d2 between the center O and the bonding front BF may decrease. If the first distance d1 between the edge of the second substrate W2 and the edge of the first substrate W1 decreases, the second distance d2 between the center O and the bonding front BF may increase.

Figure 3D:
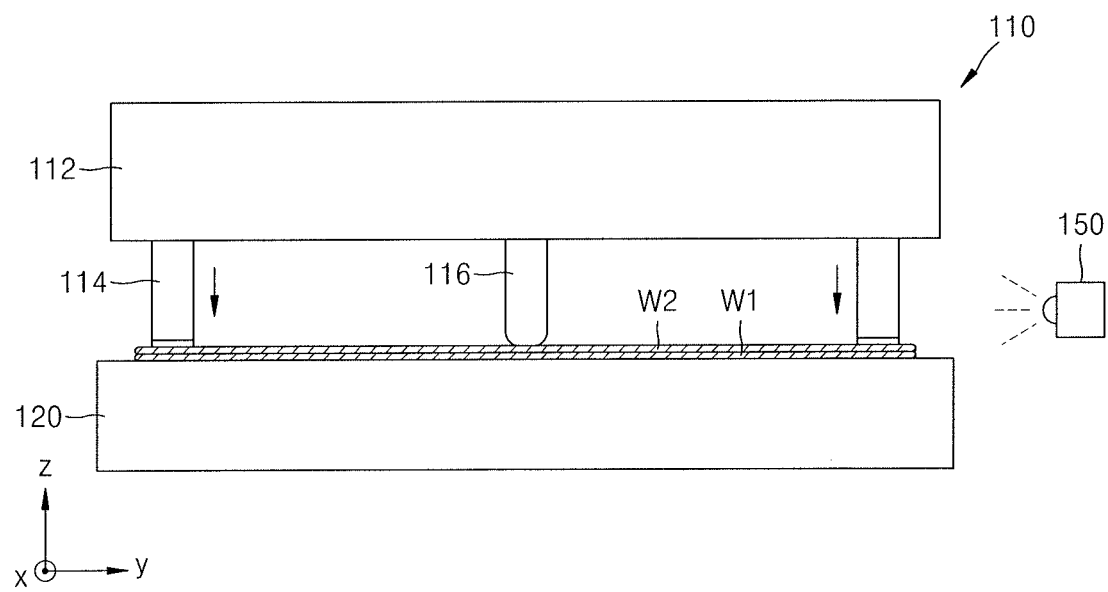

Referring to FIG. 3D, i.e., a third phase, the holding fingers 114 may descend toward the first substrate W1 such that the edge of the second substrate W2 bonds with the edge of the first substrate W1. Consequently, the first substrate W1 and the second substrate W2 may be completely bonded with each other.

At this time, not all of the holding fingers 114 may move at the same speed. Moreover, not all of the holding fingers 114 may move, e.g., displaced by the same amount. In other words, the holding fingers 114 may be independently controlled and independently operate, e.g., each of the holding fingers 114 may be independently controlled to move a predetermined distance along the z direction at a predetermined speed to achieve proper bonding between the first and second substrates W1 and W2.

In detail, a plurality of distance sensors 150 may be arranged around the first substrate W1 and the second substrate W2. The plurality of distance sensors 150 measure distances between the first substrate W1 and the second substrate W2 at their locations, respectively, and transmit the measured distances to the controller 140 of FIG. 1.

The controller 140 may calculate a distance between the first substrate W1 and the second substrate W2 at a location of each of the holding fingers 114, by using distance information corresponding to the distances between the first substrate W1 and the second substrate W2 respectively measured by the distance sensors 150. The distance between the first and second substrates W1 and W2 at the location of each of the holding fingers 114 may be calculated, via interpolation, from the distance between the first and second substrates W1 and W2 at the location of each of the distance sensors 150. However, embodiments are not limited to this.

The controller 140 may calculate a target location of each holding finger 114 for a next moment, e.g., a distance by which and a speed at which the holding finger 114 needs to move in the z direction, based on the distance between the first and second substrates W1 and W2 calculated at the location of the holding finger 114. Next, the controller 140 may transmit, to each of the holding finger actuators 114a of FIG. 1, a signal for allowing each of the holding fingers 114 to move to the calculated target location. In other words, the controller 140 may be configured to calculate, in real time, the distance between the first and second substrates W1 and W2 at the location of each holding finger 114 and to control, in real time, a target position and an operating speed of the holding finger 114, based on the calculated distance.

According to some embodiments, the holding fingers 114 may descend toward the first substrate W1 at different speeds. For example, four holding fingers 114 located in two intersecting directions from among the eight holding fingers 114 may descend at constant speeds, and the remaining four holding fingers 114 may descend at lower speeds than the descending speeds of the former holding fingers 114.

According to some embodiments, the holding fingers 114 may descend toward the first substrate W1 to different heights. For example, the four holding fingers 114 located in two intersecting directions from among the eight holding fingers 114 may have distances of H from the first substrate W1 at an arbitrary moment when the four holding fingers 114 descend, and the remaining four holding fingers 114 may have distances of (H+δH) from the first substrate W1. In other words, while the eight holding fingers 114 are descending, a height difference of δH between the height of the four holding fingers 114 and the height of the remaining four holding fingers 114 may be kept constant.

Figure 3E:
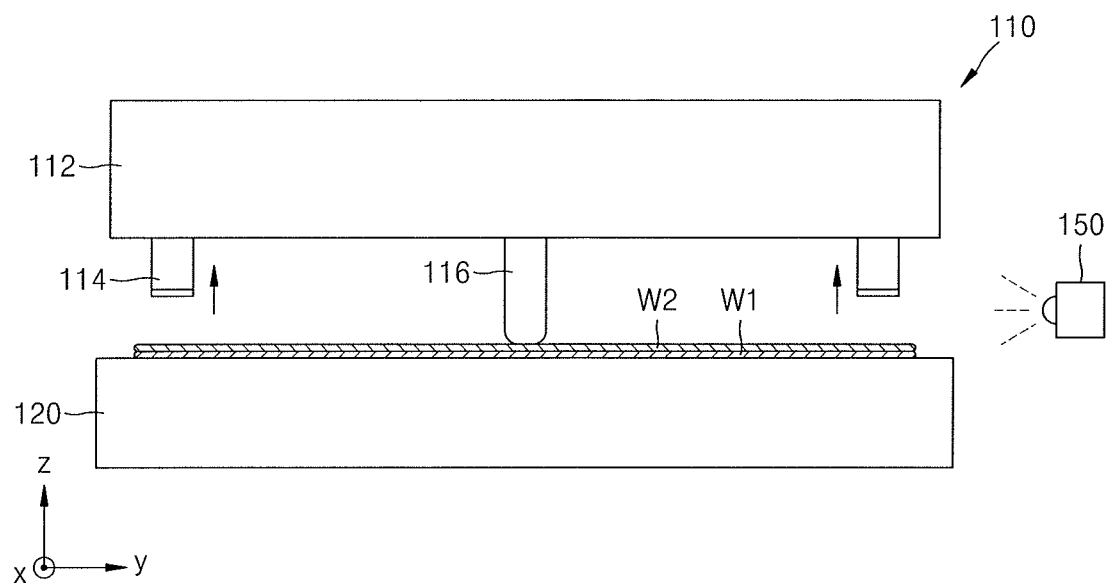

Referring to FIG. 3E, i.e., a fourth phase, the holding of the second substrate W2 may be released by the holding fingers 114. A method of releasing the holding of the second substrate W2 may vary according to the method of holding the second substrate W2. If a suction unit is provided to the holding fingers 114 and the second substrate W2 is held by the suction unit, the holding may be released by equalizing an internal pressure of the suction unit with a pressure of the outside. If power supplied to the holding fingers 114 generates an electrostatic force and the second substrate W2 is held by the electrostatic force, the holding may be released by interrupting the supply of power to the holding fingers 114. The holding-released holding fingers 114 may move in a direction away from the first substrate W1.

Figure 4A:
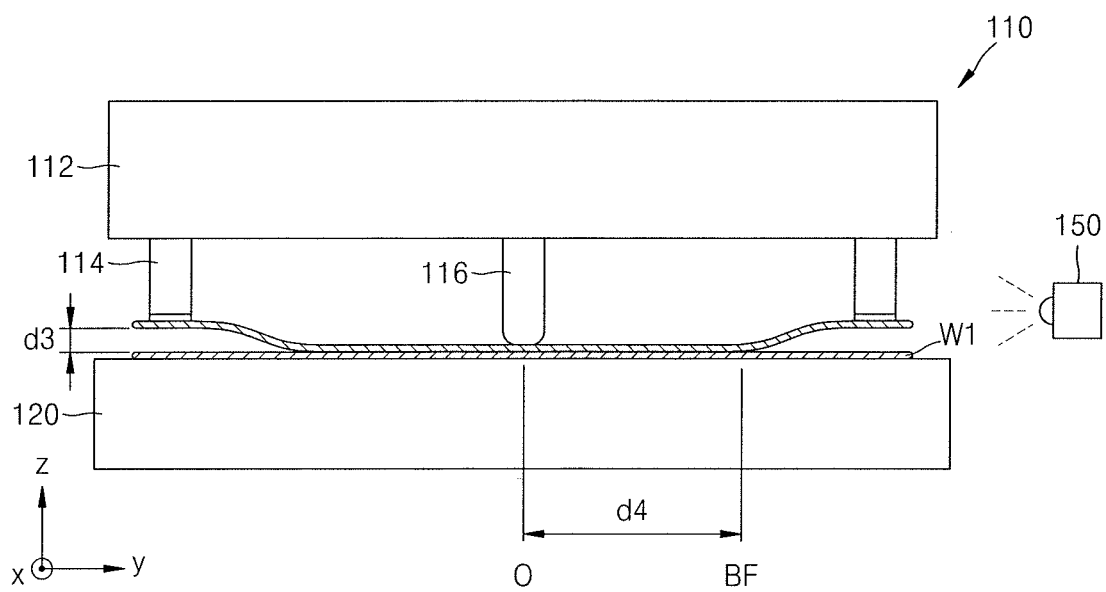
FIGS. 4A and 4B illustrate conceptual views of stages in a method of bonding a first substrate and a second substrate together, according to another embodiment.
Figure 4B:
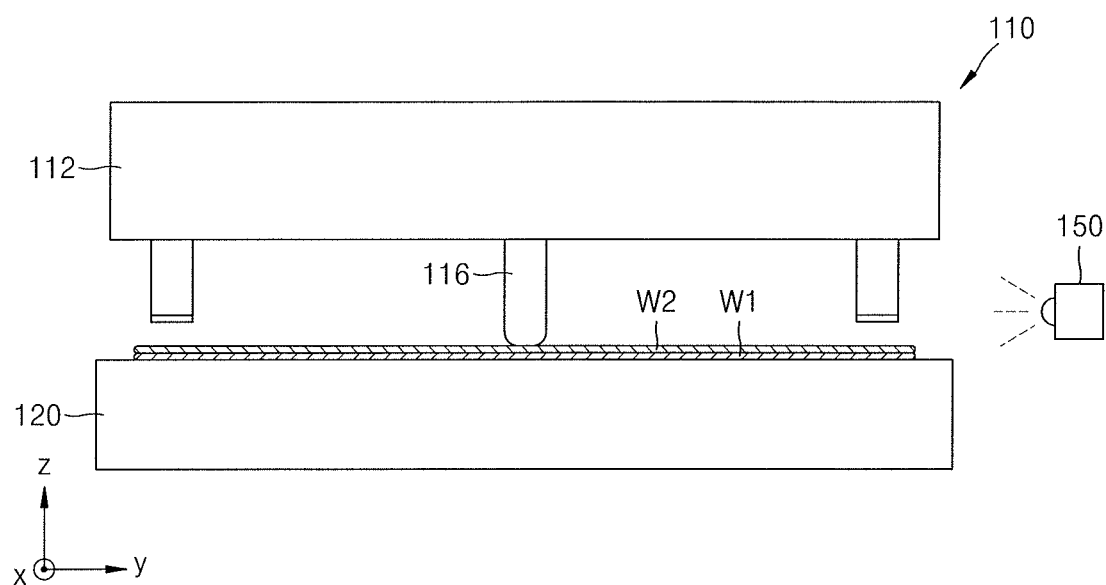

FIGS. 4A and 4B are conceptual views of stages in a method of bonding the first substrate W1 and the second substrate W2 together, according to another embodiment. The bonding method according to the present embodiment is common to the embodiment described above with reference to FIGS. 3A through 3E in terms of the operations of FIGS. 3A through 3C. Therefore, FIGS. 4A and 4B refer to operations performed after those described with reference to FIG. 3C.

Referring to FIG. 4A, the holding fingers 114 may move toward the first substrate W1 until a third distance d3 between the respective edges of the first and second substrates W2 and W1 is about 1 μm to about 50 μm. The moving of the holding fingers 114 toward the first substrate W1 may be accomplished by a cooperation between the distance sensors 150, the controller 140, and the holding finger actuators 114a, as described above with reference to FIG. 3D. During this process, the bonding front BF may be closer to the edge of the first substrate W1 than the bonding front BF of FIG. 3C. A fourth distance d4 between the center O and the bonding front BF may also be greater than the second distance d2 of FIG. 3C.

Referring to FIG. 4B, even when the edge of the second substrate W2 is apart from the edge of the first substrate W1, the holding of the second substrate W2 may be released by the holding fingers 114. The method of releasing the holding of the second substrate W2 has been described above with reference to FIG. 3E, and thus a description thereof will be omitted.

When the holding of the second substrate W2 by the holding fingers 114 is released, the bonding front BF spreads in a radial direction, i.e., in a direction toward the edge of the first substrate W1, until the edge of the second substrate W2 bonds to the edge of the first substrate W1. If, after the center of the second substrate W2 is pressed by the pressing finger 116 to contact the first substrate W1, the holding of the second substrate W2 were to be released without bringing the edge of the second substrate W2 close to the first substrate W1 by using the holding fingers 114, bonding between the first substrate W1 and the second substrate W2 would not have been sufficient, e.g., due to voids therebetween.

FIGS. 5A through 5E are conceptual views of stages in a method of bonding the first substrate W1 and the second substrate W2 together, according to another embodiment.

Figure 5A:
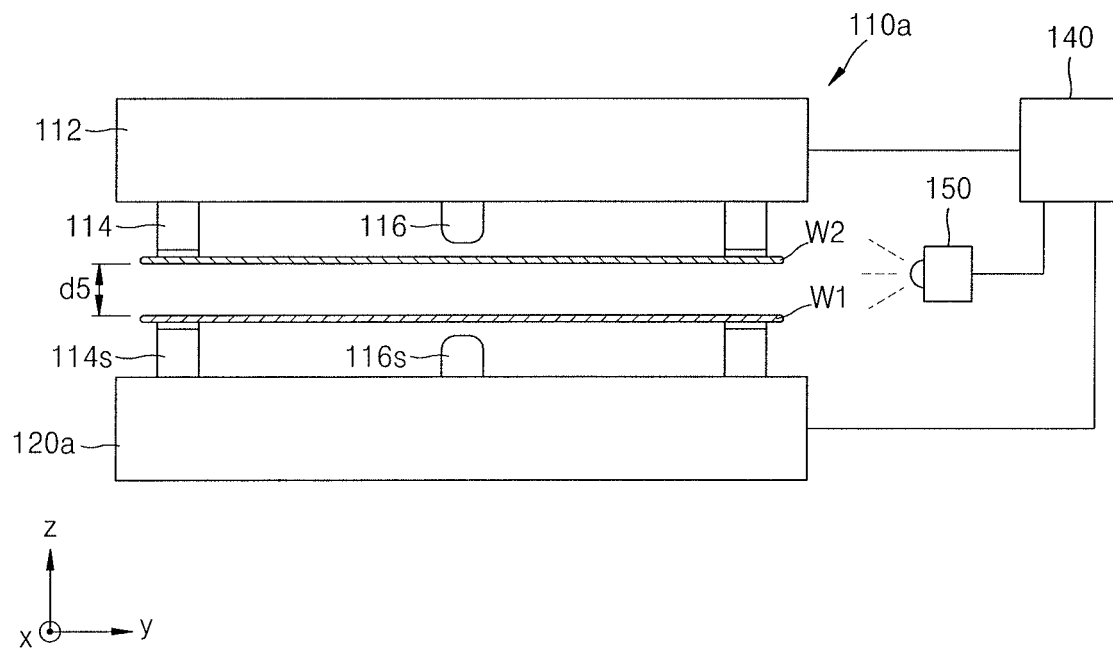
FIGS. 5A through 5E illustrate conceptual views of stages in a method of bonding a first substrate and a second substrate together, according to another embodiment.

Referring to FIG. 5A, a substrate holder 110a having the second substrate W2 held thereon may be arranged on a substrate susceptor 120a having the first substrate W1 held thereon such as to be aligned with the substrate susceptor 120a.

The substrate susceptor 120a may have susceptor holding fingers 114s in order to hold the first substrate W1. The substrate susceptor 120a may include a susceptor pressing finger 116s in order to press the first substrate W1. The susceptor holding fingers 114s and the susceptor pressing finger 116s may be arranged at locations facing the holding fingers 114 and the pressing finger 116 of the substrate holder 110a, respectively. In other words, the number of susceptor holding fingers 114s may be equal to that of holding fingers 114.

The substrate holder 110a and the substrate susceptor 120a may move relative to each other on the x-y plane in order to align the first substrate W1 with the second substrate W2 and/or to align the susceptor holding fingers 114s with the holding fingers 114.

The substrate holder 110a and the substrate susceptor 120a may move relative to each other in the z direction in order to adjust a fifth distance d5 between the first substrate W1 and the second substrate W2. The fifth distance d5 between the first substrate W1 and the second substrate W2 may be about 30 μm to about 100 μm. When the fifth distance d5 is too big, a bonding propagation may be insufficient. On the other hand, when the fifth distance d5 is too small, the bonding propagation may be excessive, and thus voids may be generated in bonding-propagated portions of the first and second substrates W1 and W2.

The alignment between the substrate holder 110a and the substrate susceptor 120a and the adjustment of the distance therebetween may be feedback-controlled by the controller 140 connected to the sensor system including the distance sensors 150.

Figure 5B:
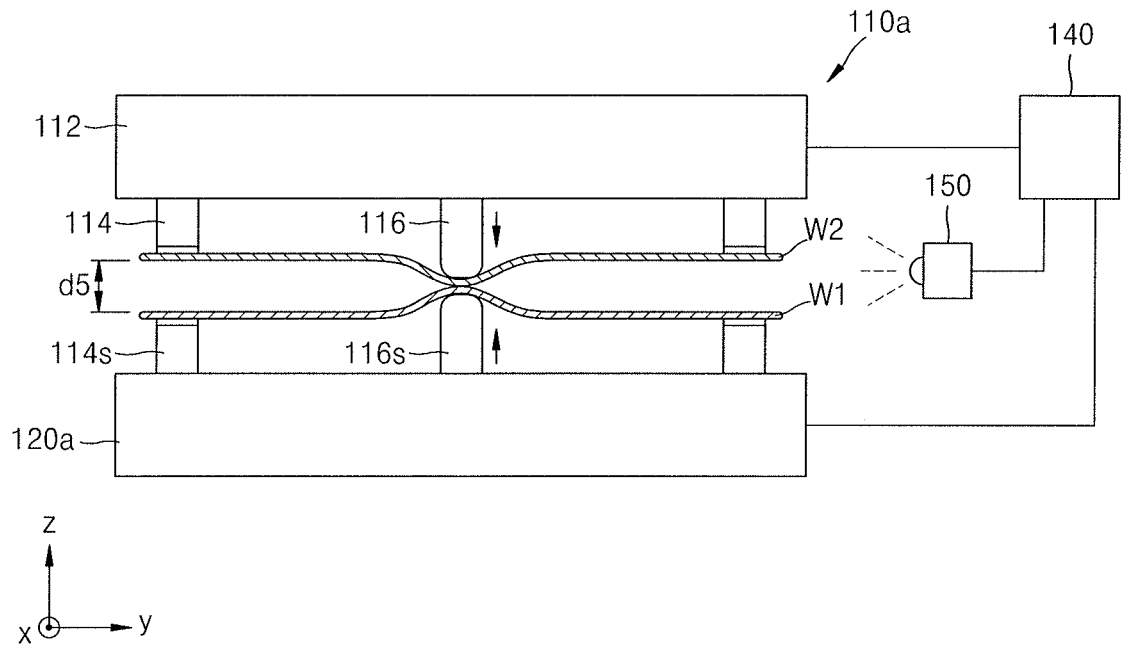

Referring to FIG. 5B, the pressing fingers 116 and 116s of the substrate holder 110a and the substrate susceptor 120a may approach each other to press the first substrate W1 and the second substrate W2 toward each other. In other words, the second substrate W2 may be pressed toward the first substrate W1 by using the pressing finger 116 of the substrate holder 110a. The first substrate W1 may be pressed toward the second substrate W2 by using the susceptor pressing finger 116s of the substrate susceptor 120a. Respective centers of the first substrate W1 and the second substrate W2 may contact each other due to the pressing.

According to some embodiments, a distance by which each of the pressing finger 116 and 116s moves may be a half of the fifth distance d5 between the two first and second substrates W1 and W2. However, embodiments are not limited thereto, and the distance by which the pressing finger 116 moves downward may be greater than the distance by which the susceptor pressing finger 116s moves upward. According to another embodiment, the distance by which the pressing finger 116 moves downward may be less than the distance by which the susceptor pressing finger 116s moves upward.

Figure 5C:
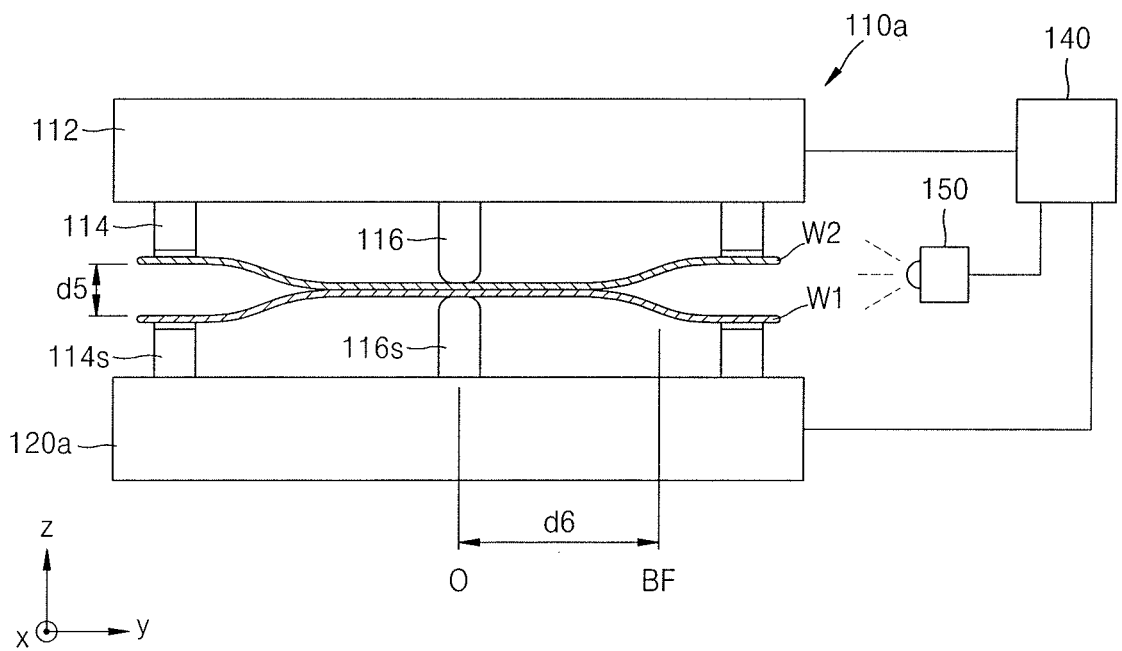

Referring to FIG. 5C, a sufficient spontaneous bonding propagation between the first substrate W1 and the second substrate W2 may be allowed. For example, the bonding propagation may be conducted until a distance between the centers of the first and second substrates W1 and W2 and the bonding front BF becomes d6. This has been described above with reference to FIG. 3C, and thus a redundant description thereof will be omitted.

Figure 5D:
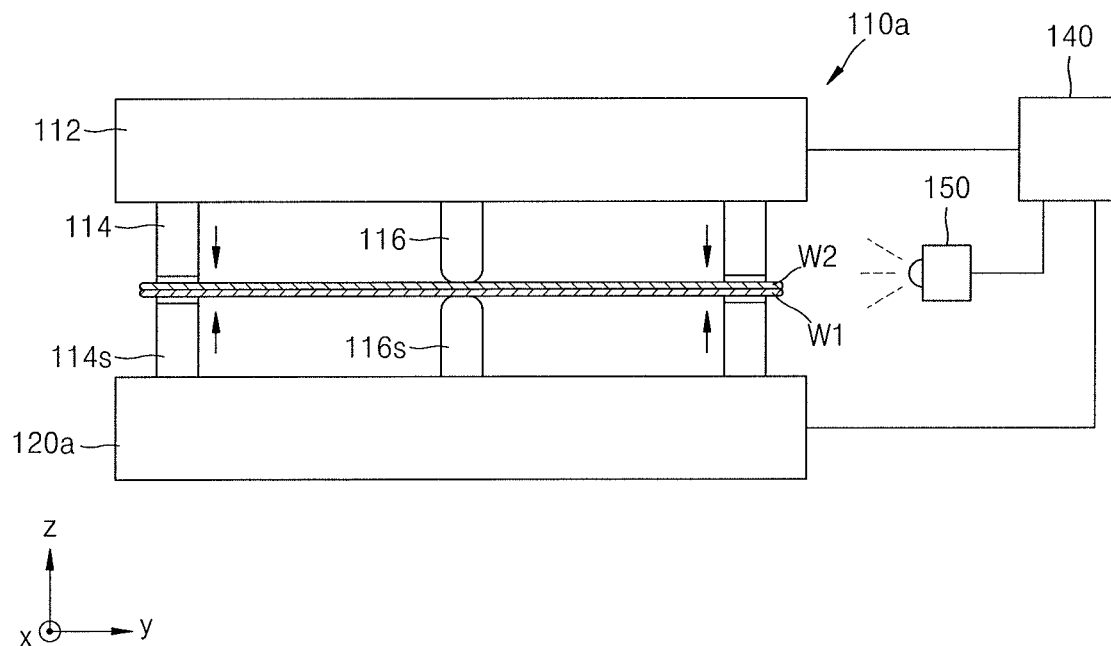

Referring to FIG. 5D, the holding fingers 114 and the susceptor holding fingers 114s may approach each other such that the edge of the second substrate W2 and the edge of the first substrate W1 bond together. At this time, the movements of the holding fingers 114 and the susceptor holding fingers 114s may be controlled by the controller 140. A control scheme of the controller 140 has been described above with reference to FIG. 3D, and thus a description thereof will not be repeated.

The holding fingers 114 and the susceptor holding fingers 114s may maintain holding the second substrate W2 and the first substrate W1, respectively, until the edge of the second substrate W2 and the edge of the first substrate W1 bond together.

Figure 5E:
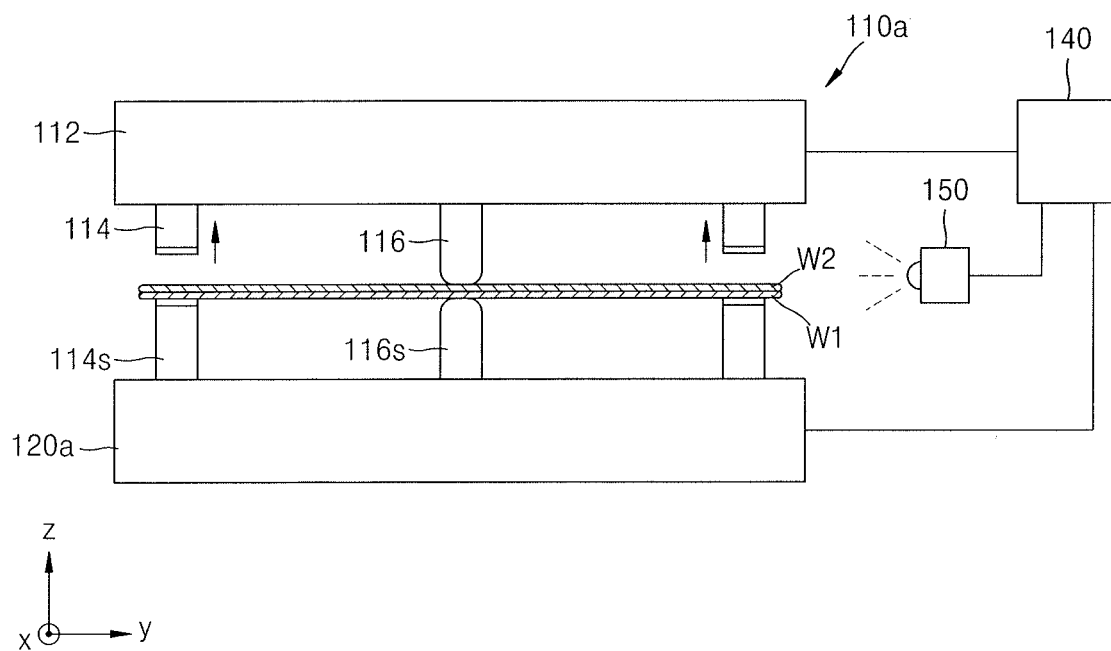

Referring to FIG. 5E, after bonding between the second substrate W2 and the first substrate W1 is completed, the holding fingers 114 may release the holding of the second substrate W2. This has been described above with reference to FIG. 3E, and thus a description thereof will not be repeated. The holding-released holding fingers 114 may be moved in a direction away from the first substrate W1.

According to the embodiment of FIGS. 5A through 5E, because the amounts by which the first and second substrates W1 and W2 are distorted, i.e., pushed along the z direction, by the pressing fingers 116 and 116s are small, more precise bonding is possible. Moreover, because both the holding fingers 114 holding the second substrate W2 and the susceptor holding fingers 114s holding the first substrate W1 are actively controlled, the first substrate W1 and the second substrate W2 may bond with each other more precisely.

FIGS. 6A through 6E are conceptual views of stages in a method of bonding the first substrate W1 and the second substrate W2 together, according to another embodiment.

Figure 6A:
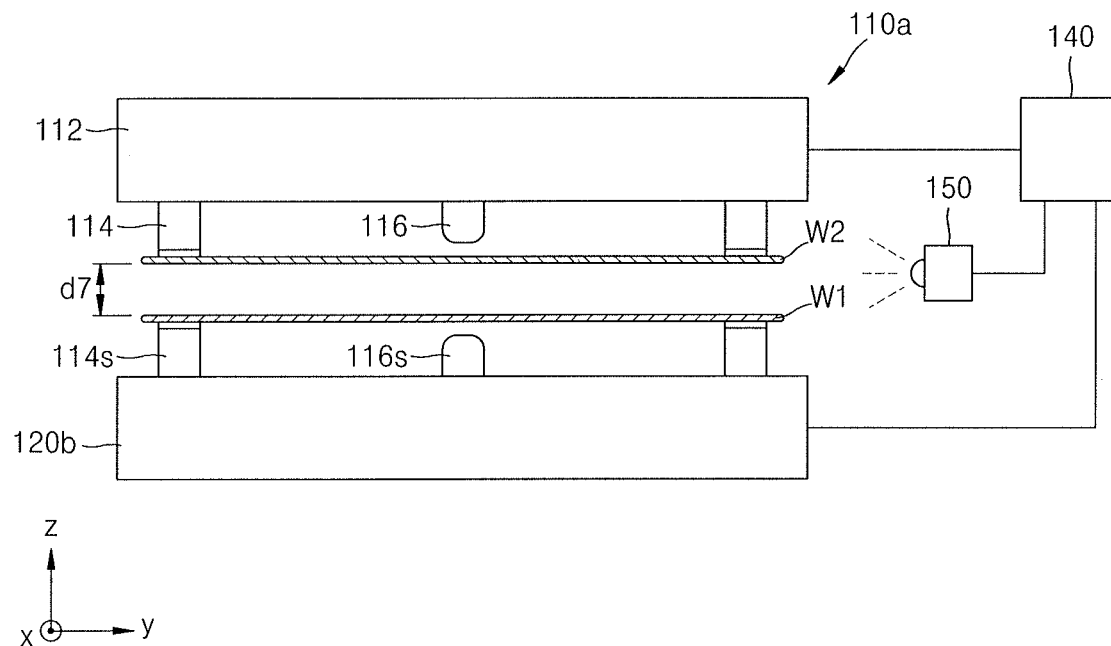
FIGS. 6A through 6E illustrate conceptual views of stages in a method of bonding a first substrate and a second substrate together, according to still another embodiment.

Referring to FIG. 6A, the substrate holder 110a having the second substrate W2 held thereon may be arranged on a substrate susceptor 120b having the first substrate W1 held thereon, such as to be aligned with the substrate susceptor 120b with a seventh distance d7 therebetween. This structure is the same as the embodiment described above with reference to FIG. 5A, and thus a description thereof will not be repeated.

Figure 6B:
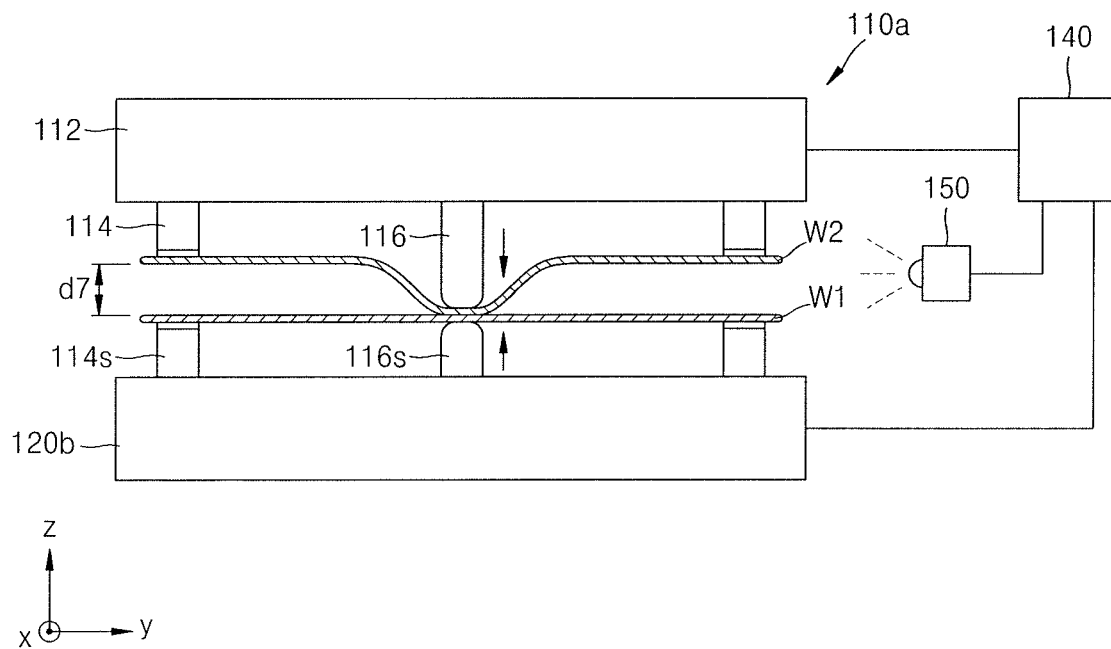

Referring to FIG. 6B, the susceptor pressing finger 116s of the substrate susceptor 120b may contact the first substrate W1 without substantially pressing the first substrate W1 upward. This is to support downward pressing of the second substrate W2 as will be described later.

The pressing finger 116 of the substrate holder 110a may press the second substrate W2 downward. The second substrate W2 may be pressed downward by the pressing finger 116 until the second substrate W2 contacts the first substrate W1. Because the first substrate W1 is supported by the susceptor pressing finger 116s, even when a pressure of the pressing finger 116 is applied to the first substrate W1, the first substrate W1 may not be substantially distorted.

Figure 6C:
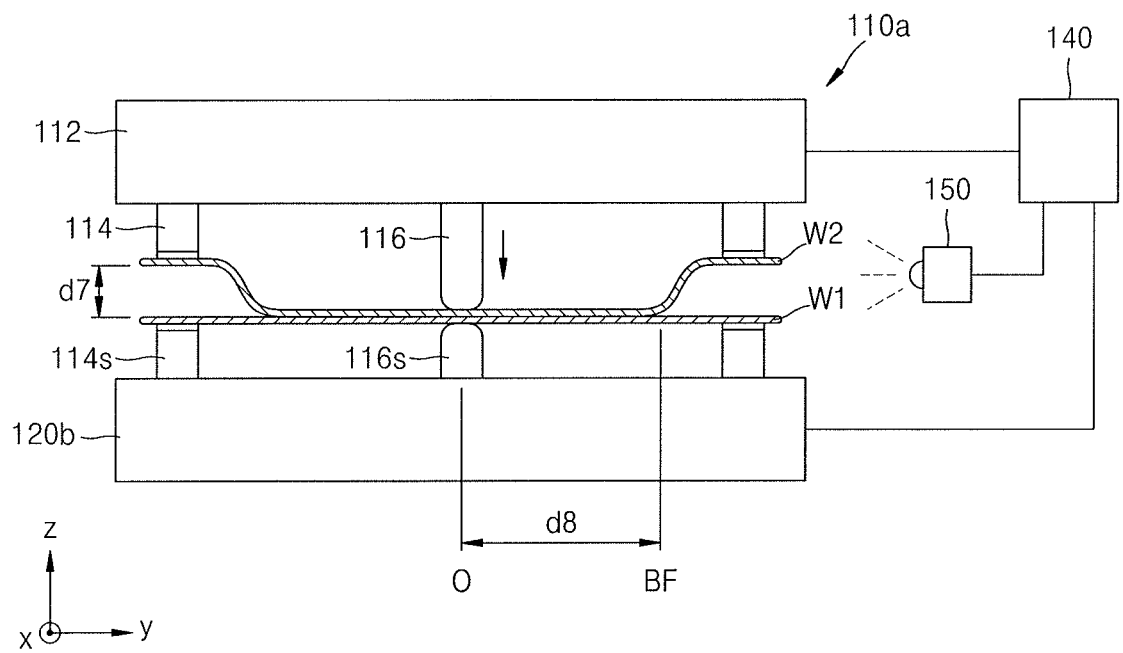

Referring to FIG. 6C, a sufficient spontaneous bonding propagation between the first substrate W1 and the second substrate W2 may be allowed. For example, the bonding propagation may be conducted until a distance between the center of the first and second substrates W1 and W2 and the bonding front BF becomes an eight distance d8. This has been described above with reference to FIG. 3C, and thus a description thereof will not be repeated.

Figure 6D:
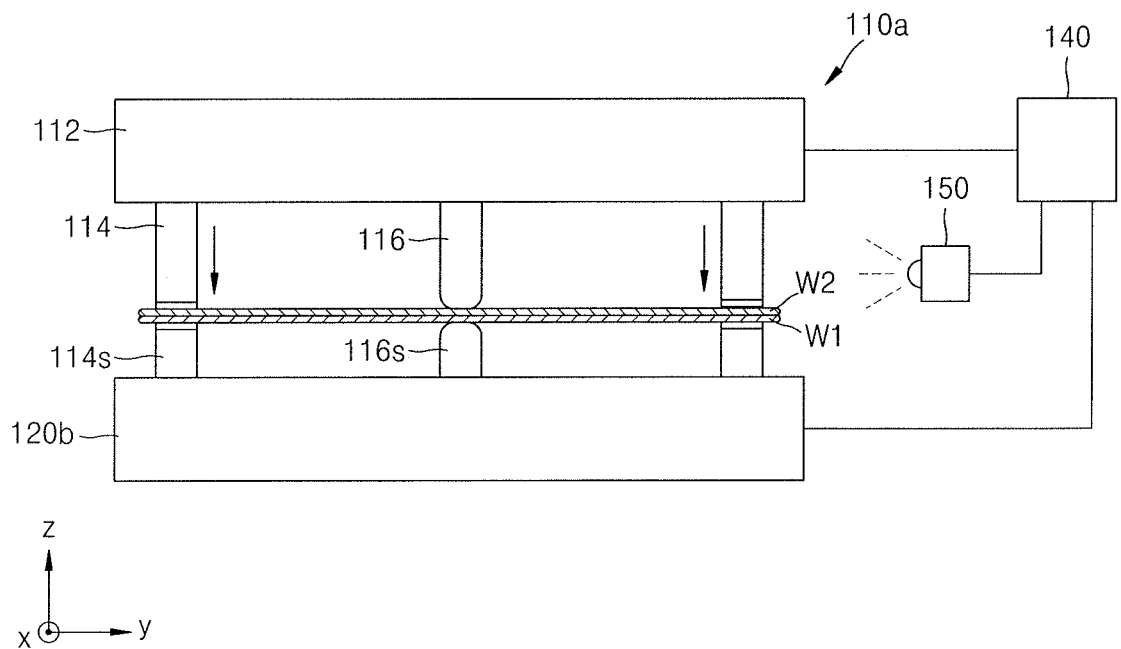

Referring to FIG. 6D, the holding fingers 114 may be brought close to the susceptor holding fingers 114s such that the respective edges of the first and second substrates W1 and W2 bond to each other. The movement of the holding fingers 114 may be controlled by the controller 140. The control scheme of the controller 140 has been described above with reference to FIG. 3D, and thus a description thereof will not be repeated. The holding fingers 114 may continue holding the second substrate W2 until the respective edges of the first and second substrates W1 and W2 bond to each other.

Figure 6E:
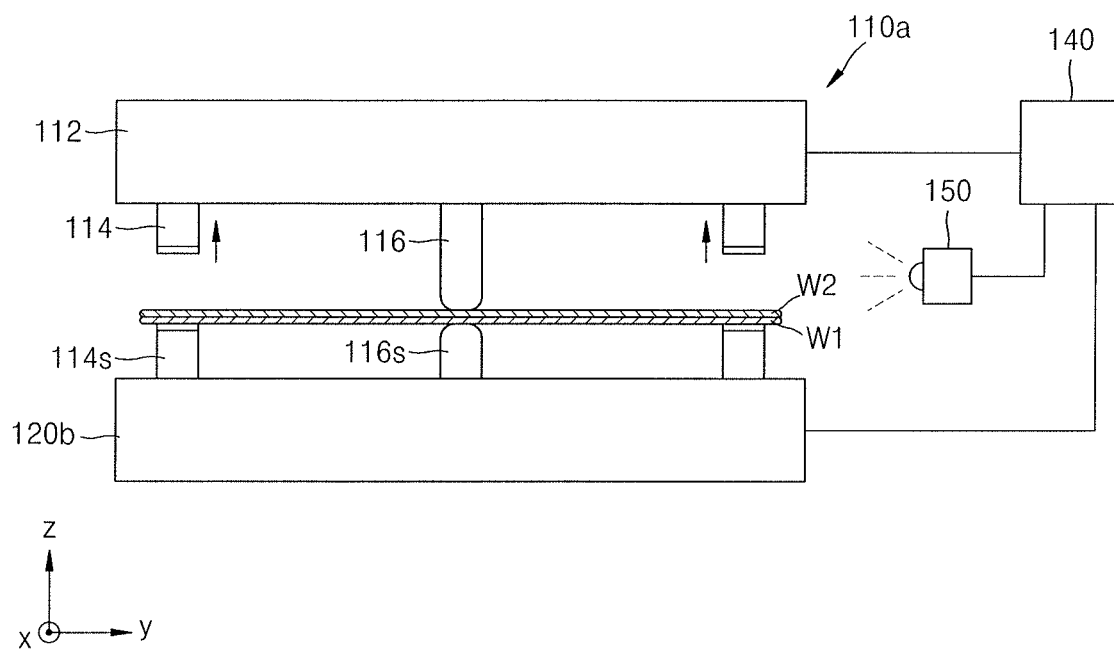

Referring to FIG. 6E, after boning between the second substrate W2 and the first substrate W1 is completed, the holding fingers 114 may release the holding of the second substrate W2. This has been described above with reference to FIG. 3E, and thus a description thereof will not be repeated. The holding-released holding fingers 114 may be moved in a direction away from the first substrate W1.

Figure 7:
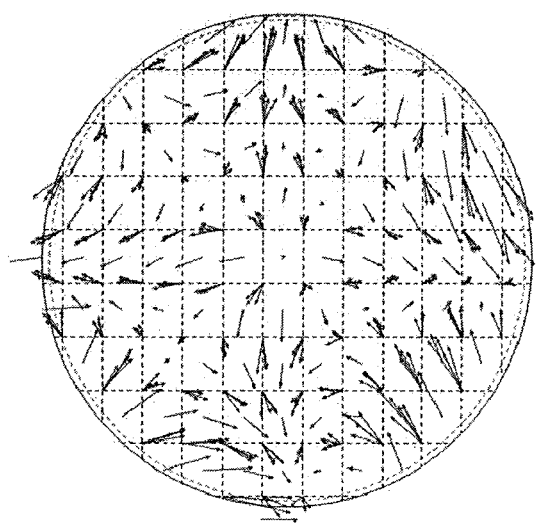
FIG. 7 illustrates a conceptual view of distortion on a substrate when holding of a second substrate is released without bringing the edge of the second substrate close to a first substrate by using holding fingers.

FIG. 7 is a conceptual view illustrating occurrence of distortion on a substrate when, after a bonding front is formed, holding of the second substrate W2 is released without bringing the edge of the second substrate W2 close to the first substrate W1 by using the holding fingers 114.

As shown in FIG. 7, the entire substrate is distorted, and, in particular, is distorted with specific directivity and in a (+)-character shape. This distortion may occur because of a crystal structure of the substrate and may occur when a single crystal substrate, e.g., a silicon substrate, is used. In detail, a [100] or [010] crystal direction (i.e., crystallographic direction) may be a direction of 45° from an [110] crystal direction. A stress in the [110] crystal direction may be less than that of each of the [100] and [010] crystal directions. Accordingly, distortion in the [110] crystal direction may be less than distortion in each of the [100] and [010] crystal directions.

On the other hand, according to embodiments, when, after a bonding front is formed, the edge of the second substrate W2 is brought close to the first substrate W1 by the holding fingers 114 and then the holding of the second substrate W2 is released, distortion in the (+)-character shape may be significantly reduced.

When the number of holding fingers 114 is greater than 4, an influence according to a crystal direction may be reduced, and thus distortion in the (+)-character shape may be reduced. According to some embodiments, when the number of holding fingers 114 is a multiple of 4, such as 8, 12, or 16, a deviation of an azimuthal direction may be reduced. Thus, these embodiments may be favorable. According to some embodiments, when the number of holding fingers 114 is an odd number, such as 5, 7, or 9, a tendency toward occurrence of distortion that is symmetrical about the center of the substrate may be reduced. Thus, these embodiments may be favorable.

Figure 8:
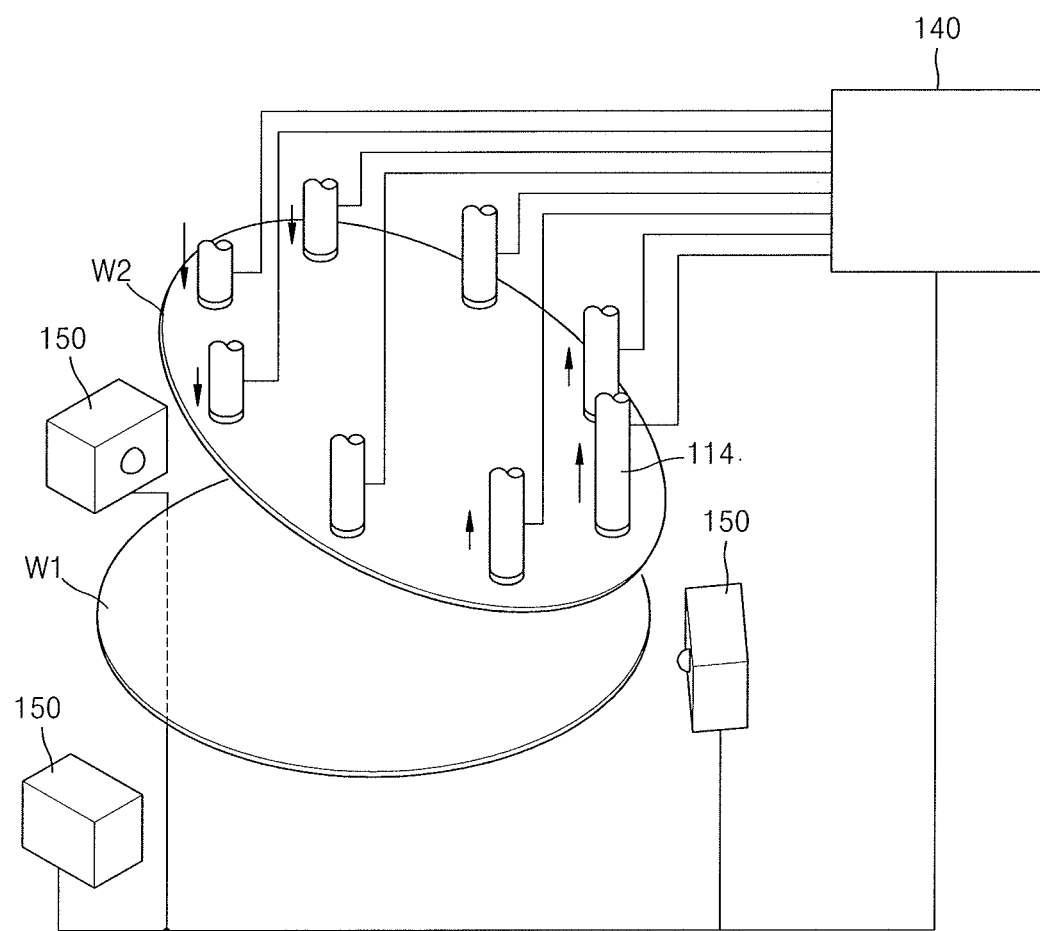
FIG. 8 illustrates a schematic diagram of a method of aligning a first substrate with a second substrate, according to an embodiment.

FIG. 8 is a schematic diagram illustrating a method of aligning the first substrate W1 with the second substrate W2, according to an embodiment.

Referring to FIG. 8, the second substrate W2 may be disposed over the first substrate W1, while the first substrate W1 and the second substrate W2 are not parallel to each other. In this case, to bond the first substrate W1 and the second substrate W2 together, arrangement of the first substrate W1 and the second substrate W2 in parallel to each other may be first needed. In other words, before the first substrate W1 and the second substrate W2 contact each other to bond together, they may be arranged in parallel to each other according to a method which will now be described.

A plurality of distance sensors 150 may be arranged around the first substrate W1. Although three distance sensors 150 are disposed in FIG. 8, four or more distance sensors 150 may be disposed.

As described above with reference to FIG. 3D, each distance sensor 150 may measure a distance between the first substrate W1 and the second substrate W2 at its location. Because the first substrate W1 and the second substrate W2 are not parallel to each other, distances between the first substrate W1 and the second substrate W2 respectively measured by the distance sensors 150 may be different from each other. The controller 140 may estimate a distance between the first substrate W1 and the second substrate W2 at a location of each of the holding fingers 114, from the distances between the first substrate W1 and the second substrate W2 respectively measured by the distance sensors 150.

The controller 140 may calculate how much each holding finger 114 is to move in the z direction to arrange the first substrate W1 and the second substrate W2 in parallel to each other, by using the estimated distance between the first substrate W1 and the second substrate W2. The controller 140 transmits the calculated values to the holding finger actuators 114a of the holding fingers 114, respectively, and the holding finger actuators 114a operate according to the received calculated values and thus the first substrate W1 and the second substrate W2 may be arranged in parallel to each other.

In FIG. 8, an arrow shown beside each of the holding fingers 114 indicates an exemplary distance, e.g., and direction, by which each of the holding fingers 114 needs to move in order to arrange the first substrate W1 and the second substrate W2 in parallel to each other. Bigger arrows among the shown arrows indicate that the holding fingers 114 need to move longer distances. Although an orientation of the second substrate W2 is adjusted in FIG. 8, one of ordinary skill in the art may understand that the same result may be obtained due to adjustment of an orientation of the first substrate W1 or orientations of the first substrate W1 and the second substrate W2.

When a comparative substrate bonding apparatus, i.e., without holding fingers 114, is used and the first substrate and the second substrate are not parallel to each other, a special, e.g., separate, unit for making them parallel to each other is needed. In contrast, when substrate bonding apparatuses according to embodiments are used and the first substrate W1 and the second substrate W2 are not parallel to each other, the plurality of holding fingers 114, e.g., which are within the substrate bonding apparatuses, may adjust positions of the first and second substrates W1 and W2 to make them parallel to each other. Thus, the aforementioned special unit employed in the comparative substrate bonding apparatus is not needed, and the substrate bonding apparatuses according to embodiments may have simplified structures.

Figure 9:
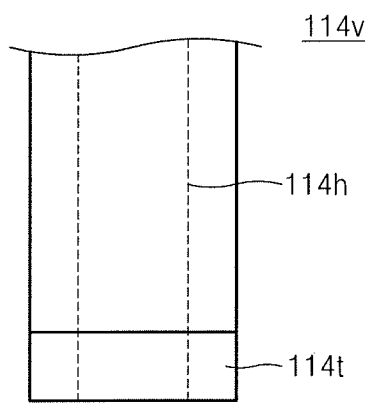
FIG. 9 illustrates a side view of a holding finger according to an embodiment.

FIG. 9 is a side view of a holding finger 114v according to an embodiment. The holding finger 114v may be substantially similar to the holding finger 114 in FIGS. 1-8.

Referring to FIG. 9, the holding finger 114v may have a fluid passage 114h that communicates with an end 114t. When the end 114t contacts the second substrate W2, the fluid passage 114h may be isolated from the outside of the holding finger 114v. When an internal pressure of the fluid passage 114h is lower than an external pressure of the holding finger 114v, the second substrate W2 may be attached to the holding finger 114v with a strength that is proportional to a difference between the two pressures.

When holding of the second substrate W2 is intended to be released, the holding may be released by making the internal pressure of the fluid passage 114h equal to or almost equal to the external pressure of the holding finger 114v. To this end, a fluid may be supplied to the fluid passage 114h via a special passage.

The end 114t may be formed of an elastic material such that the holding finger 114v and the second substrate W2 may more smoothly adhere to each other and thus may be more tightly attached to each other. For example, the end 114t may be formed of any suitable polymer material having elasticity. When the end 114t is formed of an elastic material, damage of the second substrate W2 may be reduced.

Figure 10:
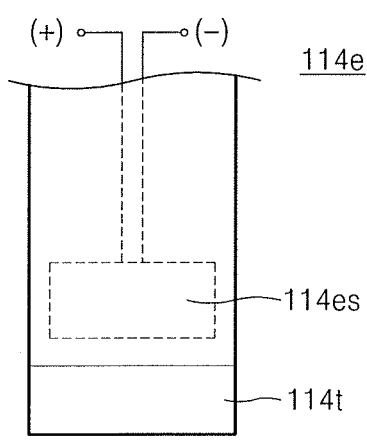
FIG. 10 illustrates a side view of a holding finger according to another embodiment.

FIG. 10 is a side view of a holding finger 114e according to another embodiment. Any of the embodiments in FIGS. 1-8 may employ fingers 114e instead of fingers 114 or 114v.

Referring to FIG. 10, the holding finger 114e may include an electrostatic device 114es capable of generating an electrostatic force, around an end 114t of the holding finger 114e. The electrostatic device 114es may generate the electrostatic force by applying power, and the second substrate W2 may be attached to the holding finger 114v by the electrostatic force. Accordingly, when supply of the power to the electrostatic device 114es is interrupted, the holding of the second substrate W2 may be immediately released.

Figure 11:
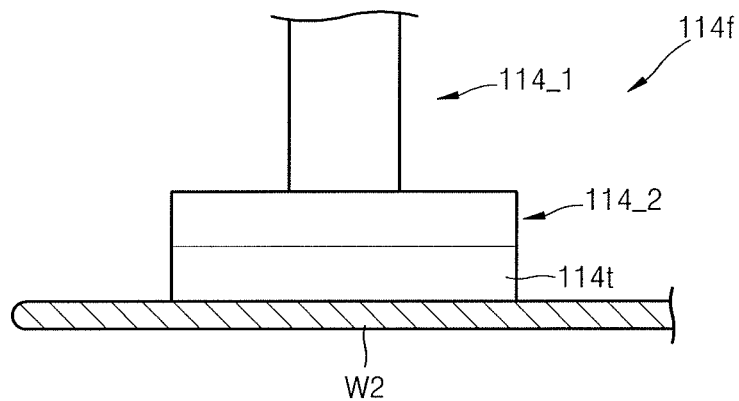
FIG. 11 illustrates a side view of a holding finger according to another embodiment.

FIG. 11 is a side view of a holding finger 114f according to another embodiment. Any of the embodiments in FIGS. 1-8 may employ fingers 114f instead of fingers 114, 114v, or 114e.

Referring to FIG. 11, the holding finger 114f may include a first portion 114_1 extending in a direction perpendicular to a main surface of the second substrate W2, and a second portion 114_2 extending in a direction parallel to the main surface of the second substrate W2. The second portion 114_2 may include the end 114t of the holding finger 114f. In other words, the second portion 114_2 may directly contact the second substrate W2.

According to some embodiments, the fluid passage 114h described above with reference to FIG. 9 may be provided within the holding finger 114f. In this case, a plurality of through holes may be provided on a bottom surface of the second portion 114_2 and may communicate with the fluid passage 114h.

According to some embodiments, the electrostatic device 114es described above with reference to FIG. 10 may be provided within the holding finger 114f. In this case, the electrostatic device 114es may be provided within the second portion 114_2.

Because the second portion 114_2 of the holding finger 114f extends in a horizontal direction (i.e., the direction parallel to the main surface of the second substrate W2), a contact area between the holding finger 114f and the second substrate W2 may be increased, and the second substrate W2 may be held with a more uniform pressure.

Figure 12:
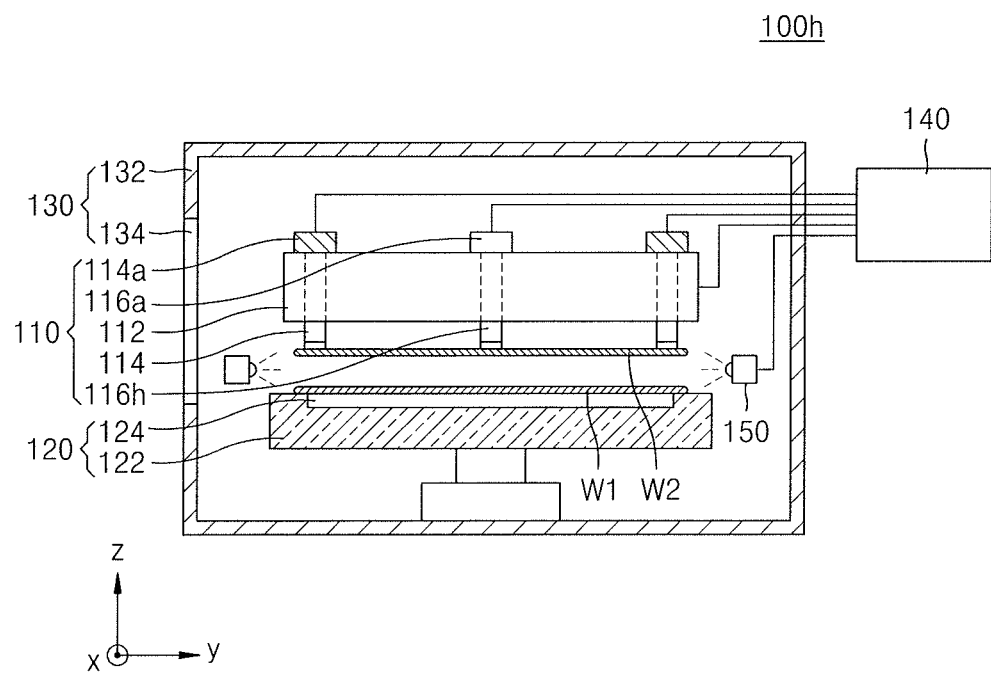
FIG. 12 illustrates a side view of a substrate bonding apparatus according to another embodiment.

FIG. 12 is a side view of a substrate bonding apparatus 100h according to another embodiment. The substrate bonding apparatus 100h of FIG. 12 is the same as the substrate bonding apparatus 100 of FIG. 1, except that a pressing finger 116h is the same as the holding fingers 114. Accordingly, a description of FIG. 12 that is the same as given above with reference to FIG. 1 will not be repeated herein, and a difference therebetween will now be mainly described.

Referring to FIG. 12, the pressing finger 116h may be configured to hold the second substrate W2. A principle that the pressing finger 116h holds the second substrate W2 may be the same as the holding fingers 114.

As substrates have become recently larger and thinner, when only the edge of a substrate is held, a center portion of the substrate may sag downward due to a load of the substrate. This may cause the second substrate W2 to be, e.g., damaged while being handled. Accordingly, when the pressing finger 116h located at the center of the second substrate W2 holds the center portion of the second substrate W2, sagging of the substrate during substrate handling may be greatly reduced.

In a substrate bonding apparatus and a substrate bonding method according to embodiments, precision of bonding substrates together may be increased, and thus a semiconductor device may be manufactured with higher precision. Moreover, the yield of a product is improved due to the higher precision, and thus manufacturing costs thereof are reduced.

Figure 13:
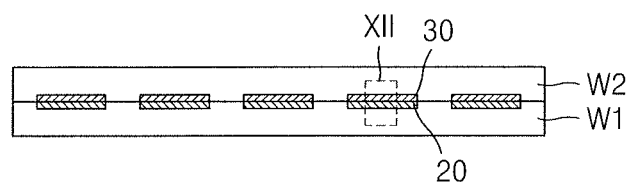
FIG. 13 illustrates a schematic diagram of a first substrate and a second substrate bonded with each other, according to an embodiment.
Figure 14:
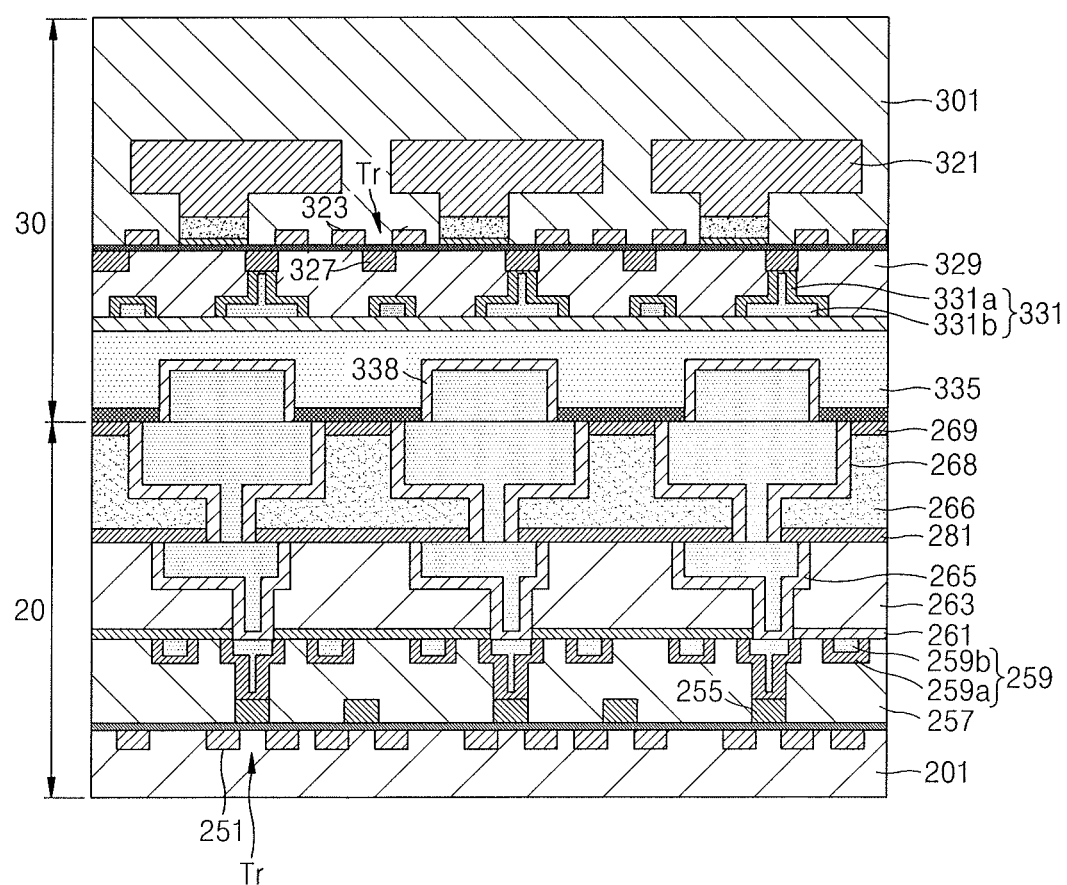
FIG. 14 illustrates a magnified cross-sectional view of portion XII of FIG. 13.

FIG. 13 is a schematic diagram illustrating the first substrate W1 and the second substrate W2 bonded with each other, according to an embodiment. FIG. 14 is a magnified cross-sectional view of a portion XII of FIG. 13.

Referring to FIG. 13, the first substrate W1 may include first semiconductor devices 20 on a surface thereof, and the second substrate W2 may include second semiconductor devices 30 on a surface thereof. The first semiconductor devices 20 and the second semiconductor devices 30 may bond with each other to constitute an integrated semiconductor device, e.g., a CMOS image sensor (CIS).

Referring to FIG. 14, a first semiconductor device 20 may include a transistor Tr having a gate electrode 255 and source and drain regions 251 on a semiconductor substrate 201, e.g., single crystal silicon. The gate electrode 255 may be electrically connected to a layer over the gate electrode 255, via first buried wires 259. The first buried wires 259 may each include a first barrier metal layer 259a and a first metal layer 259b, and may be insulated from each other by a first interlayer insulation layer 257.

Other intermediate wiring layers may include buried wires 265 and 268, each including a barrier metal layer and a metal layer, and interlayer insulation layers 263 and 266 that surround the buried wires 265 and 268 to insulate them from each other. The wiring layers may be separated from each other by diffusion prevention layers 261, 281, and 269, except for portions of the buried wires in each wiring layer that contact each other.

A second semiconductor device 30 may include a transistor Tr having a gate electrode 327 and source and drain regions 323 on a semiconductor substrate 301, e.g., single crystal silicon. The gate electrode 327 may be electrically connected to a layer below the gate electrode 327, via second buried wires 331. The second buried wires 331 may each include a second barrier metal layer 331a and a second metal layer 331b, and may be insulated from each other by a second interlayer insulation layer 329.

Other intermediate wiring layers may include buried wires 338, each including a barrier metal layer and a metal layer, and an interlayer insulation layer 335 that surrounds the buried wires 338 to insulate them from each other. Optoelectric conversion units 321 may be provided within the semiconductor substrate 301.

As shown in FIG. 14, the first substrate W1 and the second substrate W2 may bond together such that the first semiconductor device 20 and the second semiconductor device 30 are connected to each other with the buried wires 268 of the first semiconductor device 20 and the buried wires 338 of the second semiconductor device 30 facing each other.

Line widths of buried wires have become greatly thinner due to recent trends toward miniaturization of semiconductor devices. To bond the semiconductor devices together to have appropriate electrical characteristics, precision of several nanometers or less, e.g., about 40 nm or less, is needed. Therefore, when the substrate bonding apparatus and the substrate bonding method described above with reference to FIGS. 1 through 4B, FIG. 8, and FIG. 12 are used, a semiconductor device may be manufactured with higher precision.

The methods and processes described herein may be performed by code or instructions to be executed by a computer, processor, manager, or controller. Because the algorithms that form the basis of the methods (or operations of the computer, processor, or controller) are described in detail, the code or instructions for implementing the operations of the method embodiments may transform the computer, processor, or controller into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, or controller which is to execute the code or instructions for performing the method embodiments described herein.

By way of summation and review, embodiments provide a substrate bonding apparatus and a substrate bonding method capable of manufacturing a semiconductor device at low costs and with improved precision. That is, embodiments provide independently controlled holding fingers as part of a substrate holder for holding a substrate. The holding fingers move toward a lower substrate until an edge of an upper substrate contacts the lower substrate, and, after the upper substrate and the lower substrate bond together, holding is released, e.g., as opposed to a comparative apparatus that causes an edge of the substrate to freely fall due to release of the holding when edges of substrates are far apart from each other. Moreover, while the holding fingers are being independently controlled, a bonding front situation (distance between substrates) of a substrate is ascertained in real time, and a moving speed, a displacement, and the like of the holding fingers are controlled by reflecting the bonding front situation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate bonding method, comprising:
    arranging a substrate susceptor to hold a first substrate thereon;
    arranging a substrate holder to hold a second substrate thereon such that the first and second substrates are aligned with each other, the substrate holder including a plurality of holding fingers configured to hold an edge of the second substrate and move independently from each other;
    bringing a center of the second substrate to contact the first substrate;
    allowing a spontaneous bonding propagation between the first substrate and the second substrate to occur;
    bringing the second substrate closer to the first substrate while holding the edge of the second substrate; and
    releasing the holding of the edge of the second substrate.

2. The substrate bonding method as claimed in claim 1, wherein bringing the second substrate close to the first substrate includes independently controlling the plurality of holding fingers to move toward the first substrate.

3. The substrate bonding method as claimed in claim 1, further comprising:
    measuring a distance between an edge of the first substrate and the edge of the second substrate using a distance sensor,
    wherein a movement of each of the plurality of holding fingers is controlled based on the distance sensed by the distance sensor.

4. The substrate bonding method as claimed in claim 3, further comprising:
    calculating a target location of each of the plurality of holding fingers based on the distance sensed by the distance sensor; and
    moving each of the plurality of holding fingers to the target location.

5. The substrate bonding method as claimed in claim 3, wherein releasing the holding of the edge of the second substrate includes releasing the holding of the edge of the second substrate when the distance between the edge of the second substrate and the edge of the first substrate is about 1 μm to about 50 μm.

6. The substrate bonding method as claimed in claim 1, wherein bringing the second substrate closer to the first substrate includes bonding the edge of the second substrate to an edge of the first substrate.

7. The substrate bonding method as claimed in claim 1, wherein, in bringing the second substrate closer to the first substrate, distances by which the plurality of holding fingers move, respectively, are not equal to each other.

8. The substrate bonding method as claimed in claim 1, further comprising:
    adjusting an orientation of the second substrate such that the first substrate and the second substrate are parallel to each other, before allowing the center of the second substrate to contact the first substrate,
    wherein the orientation of the second substrate is adjusted such that the second substrate is parallel to the first substrate, by independently controlling the plurality of holding fingers.

9. The substrate bonding method as claimed in claim 1, wherein the plurality of holding fingers are to hold the second substrate on respective ends of the plurality of holding fingers by an attraction formed on the respective ends of the plurality of holding fingers.

10. The substrate bonding method as claimed in claim 9, wherein each of the plurality of holding fingers has a fluid passage that communicates with each of the respective ends of the plurality of holding fingers, the attraction being formed by maintaining an internal pressure of the fluid passage to be lower than an ambient pressure.

11. The substrate bonding method as claimed in claim 9, wherein:
    the plurality of holding fingers are to hold the second substrate on respective ends of the plurality of holding fingers via an electrostatic attraction, and
    the plurality of holding fingers are to apply an electrostatic force to the second substrate and release the electrostatic force from the second substrate to control application of the electrostatic attraction.

12. The substrate bonding method as claimed in claim 1, wherein bringing the center of the second substrate to contact the first substrate includes pressing a central portion of the second substrate toward the first substrate with a pressing finger provided in the substrate holder.

13. The substrate bonding method as claimed in claim 12, wherein:
    the substrate susceptor includes a plurality of susceptor holding fingers configured to hold the first substrate, and
    bringing the second substrate closer to the first substrate includes independently controlling the plurality of susceptor holding fingers to move toward the second substrate.

14. The substrate bonding method as claimed in claim 13, wherein bringing the center of the second substrate to contact the first substrate includes pressing a central portion of the first substrate toward the second substrate with a susceptor pressing finger provided in the substrate susceptor.

15. The substrate bonding method as claimed in claim 1, wherein the first substrate and the second substrate are single crystal substrates.

16. A substrate bonding method, comprising:
    arranging a substrate susceptor to hold a first substrate thereon;
    arranging a substrate holder to hold a second substrate thereon such that the first substrate and the second substrate are aligned with each other, the substrate holder including a plurality of holding fingers configured to hold an edge of the second substrate and move independently from each other;

measuring a distance between an edge of the first substrate and the edge of the second substrate using a distance sensor;

bringing a center of the second substrate to contact the first substrate;

moving the plurality of holding fingers toward the first substrate while holding the edge of the second substrate; and releasing the holding of the edge of the second substrate, wherein each of the plurality of holding fingers is controlled based on the distance sensed by the distance sensor.

17. The substrate bonding method as claimed in claim 16, wherein a target position and a speed of each of the plurality of holding fingers are determined based on the distance sensed by the distance sensor.

18. The substrate bonding method as claimed in claim 16, wherein:
the substrate susceptor includes a plurality of susceptor holding fingers configured to hold the first substrate, and the substrate bonding method further comprises moving the plurality of susceptor holding fingers toward the second substrate while the plurality of holding fingers move toward the first substrate.

19. The substrate bonding method as claimed in claim 16, wherein bringing the center of the second substrate to contact the first substrate includes:

pressing a central portion of the second substrate toward the first substrate with a pressing finger provided in the substrate holder; and pressing a central portion of the first substrate toward the second substrate with a susceptor pressing finger provided in the substrate susceptor.

20. A substrate bonding method, comprising:

arranging a substrate susceptor to hold a first substrate thereon;

arranging a substrate holder to hold a second substrate thereon such that the first and second substrates are aligned with each other, the substrate holder including a plurality of holding fingers configured to hold an edge of the second substrate and move independently from each other;

measuring a distance between an edge of the first substrate and the edge of the second substrate using a distance sensor;

bringing a center of the second substrate to contact the first substrate;

allowing a spontaneous bonding propagation between the first substrate and the second substrate to occur while holding the edge of the second substrate;

moving the plurality of holding fingers toward the first substrate while holding the edge of the second substrate; and releasing the holding of the edge of the second substrate, wherein each of the plurality of holding fingers is controlled based on the distance sensed by the distance sensor.

* * * * *